US012787187B2

(12) United States Patent
Keum et al.

(10) Patent No.: US 12,787,187 B2
(45) Date of Patent: Nov. 3, 2026

(54) DISPLAY DEVICE HAVING FASTENING STRUCTURE FOR MODULE COVER

(71) Applicant: LG ELECTRONICS INC., Seoul (KR)

(72) Inventors: Kitae Keum, Seoul (KR); Sungmo Im, Seoul (KR); Hyuncheol Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 154 days.

(21) Appl. No.: 18/640,929

(22) Filed: Apr. 19, 2024

(65) Prior Publication Data

US 2025/0151214 A1 May 8, 2025

(30) Foreign Application Priority Data

Nov. 8, 2023 (KR) ........................ 10-2023-0153374

(51) Int. Cl.
*H05K 5/02* (2006.01)

(52) U.S. Cl.
CPC .................................. *H05K 5/0221* (2013.01)

(58) Field of Classification Search
CPC .......... H05K 5/0221; H05K 5/03; H05K 5/15; G06F 1/1601; G02F 1/133325; G02F 2201/46; G02F 2201/465; G02F 1/133314; G02F 1/133317; H10K 59/87
See application file for complete search history.

(56) References Cited

U.S. PATENT DOCUMENTS

| | | | | |
|---|---|---|---|---|
| 9,235,937 | B1 * | 1/2016 | Weinberg | G07C 5/008 |
| 2013/0003290 | A1 * | 1/2013 | Chen | G06F 1/187 361/679.34 |
| 2016/0138629 | A1 * | 5/2016 | Flynn | F16B 13/063 411/57.1 |
| 2016/0353593 | A1 * | 12/2016 | Park | H05K 5/0234 |
| 2021/0200018 | A1 | 7/2021 | Kim et al. | |

FOREIGN PATENT DOCUMENTS

| | | | | |
|---|---|---|---|---|
| EP | 3098644 B1 | 7/2020 | | |
| KR | 10-2019-0004954 A | 1/2019 | | |
| KR | 10-2022-0065795 A | 5/2022 | | |
| TW | 201302026 A | * | 1/2013 | G06F 1/187 |

OTHER PUBLICATIONS

Extended European Search Report for European Patent Application No. 24 17 3606, dated Oct. 17, 2024.

* cited by examiner

*Primary Examiner* — James Wu
(74) *Attorney, Agent, or Firm* — Birch, Stewart, Kolasch & Birch, LLP

(57) ABSTRACT

Disclosed is a display device including a display panel, a module cover supporting a rear surface of the display panel and including a holder hole defined therein, a back cover covering a rear surface of the module cover, a holder rubber made of an elastic material, fixed to the holder hole, and including a latch hole defined therein, and a latch protruding from a front surface of the back cover and fastened to the latch hole of the holder rubber. Because a fastening structure is thin, the thin display device is implemented.

9 Claims, 7 Drawing Sheets

(a)

(b)

DISPLAY DEVICE HAVING FASTENING STRUCTURE FOR MODULE COVER

This application claims the benefit of Korean Patent Application No. 10-2023-0153374, filed on Nov. 8, 2023, which is hereby incorporated by reference as if fully set forth herein.

BACKGROUND

Field

The present disclosure relates to a display device that simplifies a fastening structure that fastens a module cover with a back cover that constitute a rear surface structure of the display device.

Discussion of the Related Art

With growth of information society, demand for various display devices has increased. In order to satisfy such demand, in recent years, a liquid crystal display (LCD), a field emission display (FED), a plasma display panel (PDP), and an electroluminescent device have been developed as display devices.

A liquid crystal panel of the liquid crystal display includes a liquid crystal layer and a TFT substrate and a color filter substrate opposite each other in the state in which the liquid crystal layer is interposed therebetween, wherein a picture is displayed using light provided from a backlight unit.

An active matrix type organic light-emitting display has come onto the market as an example of the electroluminescent device. Since the organic light-emitting display is self-emissive, the organic light-emitting display has no backlight, compared to the liquid crystal display, and has merits in terms of response time and viewing angle, and therefore the organic light-emitting display has attracted attention as a next-generation display.

Recently, because a material such as an OLED emits light by itself without a backlight structure on a rear surface, a bendable display module may be implemented, so that a curved display device or an ultra-thin display may be implemented.

In addition to a thickness of the display module, the number and sizes of other members are important factors in determining a thickness of the display device. Therefore, research to reduce the number of members connected to a rear surface of the display module and reduce sizes thereof is also being conducted.

SUMMARY

The present disclosure is to provide a display device that simplifies a fastening structure that fastens a module cover with a back cover that constitute a rear surface structure of the display device.

Provided is a display device including a display panel, a module cover supporting a rear surface of the display panel and including a holder hole defined therein, a back cover covering a rear surface of the module cover, a holder rubber made of an elastic material, fixed to the holder hole, and including a latch hole defined therein, and a latch protruding from a front surface of the back cover and fastened to the latch hole of the holder rubber.

The holder rubber may include a first portion located on a front surface of the module cover, a second portion located inside the holder hole and having a diameter corresponding to a size of the holder hole, and a third portion located on the rear surface of the module cover, and diameters of the first portion and the third portion may be greater than the size of the holder hole.

The first portion may include an inclined surface widening rearward.

The latch may include an extending portion having a length in a first direction greater than a length in a second direction and a hook protruding from the extending portion in the second direction, and the holder rubber may have an oval shape with a length in the first direction greater than a length in the second direction.

The first direction may be a long side direction of the display device, the second direction may be a short side direction of the display device, and the second direction may be a downward direction of the display device.

The latch hole may include an entry portion with an inclined surface narrowing forward, and an engaging portion expanding while forming a step at a front end of the entry portion, and the hook of the latch may be caught on the step between the engaging portion and the entry portion.

A size of a portion of the entry portion connected to the engaging portion may be greater than a size of the latch in the first direction.

A size of a portion of the entry portion connected to the engaging portion may be equal to or smaller than a size of the extending portion of the latch in the second direction.

The holder hole may include hemming at a periphery.

The module cover may have a portion where the holder hole is defined protruding rearward.

The display device of the present disclosure may have the thin fastening structure, so that the thin display device may be implemented.

In the display device of the present disclosure, the holder rubber may be made of the elastic material and may fix the latch, thereby acquiring the stable fastening force while receiving the error resulted from the thermal expansion.

In the display device of the present disclosure, the fastening structure may have the simple configuration, thereby reducing the manufacturing cost.

The effects obtainable from the present disclosure are not limited to those mentioned above, and other effects not mentioned will be apparent to one having ordinary skill in the art from the following description.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
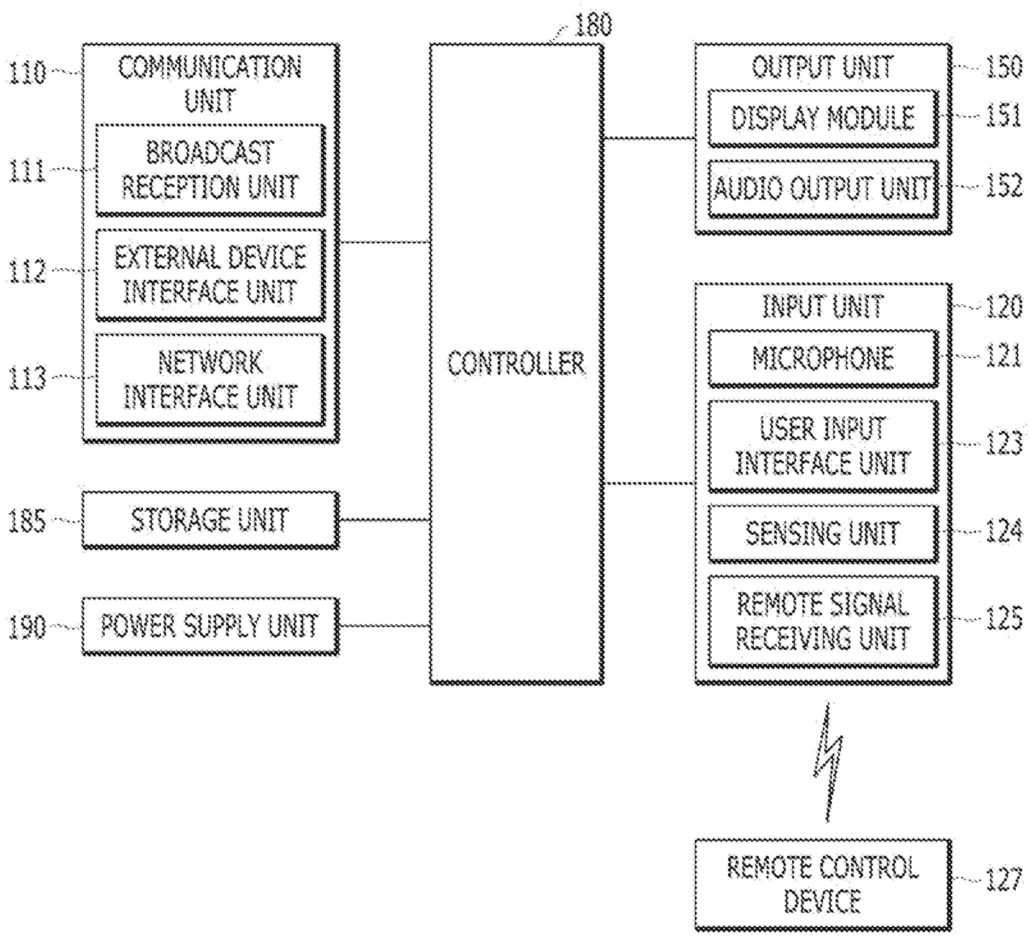
FIG. 1 is a block diagram illustrating components of a display device according to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Meanwhile, an image display device described in this specification is, for example, an intelligent image display device having a computer supporting function in addition to a broadcast reception function, wherein an Internet function may be added while the broadcast reception function is devotedly performed, whereby an interface that is more conveniently used, such as a handwriting type input device, a touchscreen, or a space remote control, may be provided. In addition, the image display device may be connected to the Internet or a computer through support of a wired or wireless Internet function, whereby various functions, such as e-mail, web browsing, banking, or gaming, may be executed. For such various functions, a standardized general-purpose OS may be used.

In the image display device described in the present disclosure, therefore, various applications may be freely added or deleted, for example, on a general-purpose OS kernel, whereby various user friendly functions may be executed. More specifically, the image display device may be a network TV, an Hbb TV, or a smart TV, and is applicable to a smartphone depending on circumstances.

FIG. 1 is a block diagram illustrating components of a display device 100.

The display device 100 may include a communication unit 110, an input unit 120, a sensing unit 124, an output unit 150, a controller 180, a storage unit 185, and a power supply 190. The configuration shown in FIG. 1 may include only some of the components, and one configuration may perform two functions.

The communication unit 110 may include a broadcast reception unit 111 including a tuner unit and a demodulator. The tuner unit of the broadcast reception unit 111 may select a broadcast signal corresponding to a channel selected by a user or any one of all pre-stored channels, among broadcast signals received through an antenna (not shown) or a cable (not shown). The tuner unit 111 may convert the selected broadcast signal into an intermediate frequency signal or a baseband video or audio signal.

The tuner unit may sequentially select broadcast signals of all broadcast channels stored through a channel memory function, among received broadcast signals, and may convert each of the selected broadcast signals into an intermediate frequency signal or a baseband video or audio signal The demodulation unit of the broadcast reception unit 111 may receive the digital IF (DIF) signal converted by the tuner unit, and may perform demodulation. After performing demodulation and channel decryption, the demodulation unit may output a stream signal (TS). At this time, the stream signal may be a multiplexed image, audio, or data signal.

The stream signal output from the demodulation unit may be input to the controller 180. After performing demultiplexing and image/audio signal processing, the controller 180 may output an image through the display module 151, and may output audio through the audio output unit 152.

An external device interface unit 112 may connect an external device to the display device 100 to receive an image signal, an audio signal, and a control signal from the external device. The interface unit 112 may be connected by wire/wireless to external devices such as a Digital Versatile Disk (DVD), a Blu-ray, a game device, a camera, a camcorder, a computer (laptop), and the like.

The external device interface unit 112 transmits video, audio, or data signals inputted externally to the controller 180 of the display device 100 through the connected external device. In addition, the video, audio, or data signals processed by the controller 180 may be outputted to the connected external device.

The external device interface unit 112 may include a wired type and a wireless type. The wired type includes a physical terminal provided to the display device 100, and the wireless type may be connected to an external device through an antenna that receives a wireless signal.

The wired type may include a USB terminal, a Composite Video Banking Sync (CVBS) terminal, a component terminal, an S-video terminal (analog), a Digital Visual Interface (DVI) terminal, a High Definition Multimedia Interface (HDMI) terminal, an RGB terminal, a D-SUB terminal, and so on.

The wireless type may perform short-range wireless communication with other electronic devices located nearby. The display device 100 may be connected to other electronic devices via networks according to communication standards such as Bluetooth, Radio Frequency Identification (RFID), Infrared Data Association (IrDA), Ultra Wideband (UWB), ZigBee, Digital Living Network Alliance (DLNA), etc.

The network interface unit 113 may access a prescribed web page through a connected network or another network linked to the connected network. That is, the network interface unit 113 may transmit and receive data with a corresponding server by accessing the prescribed web page through the network. In addition, the network interface unit 113 may receive contents or data provided by a content provider or a network operator.

That is, contents such as movies, advertisements, games, VODs, and broadcast signals provided from content providers or network providers and information related to such contents may be received through the network. In addition, update information and update files of firmware provided by the network operator may be received. In addition, data may be transmitted to the Internet or content provider or network operator.

In addition, the network interface unit 113 may select a desired application from applications opened to the public and receive the selected application through the network.

According to an embodiment, when a game application is executed in the display device, the network interface unit 113 may transmit or receive prescribed data to or from a user terminal connected to the display device via the network. Also, prescribed data may be transmitted or received with a server that stores game scores The input unit 120 may include a microphone 121 that collects sound, a user input unit 123 that detects a user's command, a sensor unit that senses a state and surrounding state of the display device, and a remote signal reception unit 125 that receives a signal of a remote controller 127.

The microphone 121 may recognize a user's voice or surrounding sound, and in particular, receive a user's voice and process it as electrical audio data. Various noise cancellation algorithms for removing noise generated in the process of receiving an external audio signal may be implemented in the microphone 121.

The microphone 121 may simply collect user's voice, convert the collected voice into audio data, and store it in the storage unit 185 or transmit it to the external device via the communication unit 110, and may also perform a function as the user input unit 123 in a manner of analyzing the audio data and recognizing it as a user command.

In addition to the main body of the display device 100, the microphone 121 may be mounted on the remote controller 127, which will be described later, and the corresponding audio data may be forwarded to the controller 180 through the remote signal reception unit 125.

The user input unit 123 is a device to which a user inputs a control command for controlling the display device. The user input unit 123 may include a keypad, a button, a touch pad, a touch screen, etc.

When the user input unit 123 includes a hard key button, a user may input a command related to the display device 100 through a push operation of the hard key button. When the user input unit 123 is provided with a touchscreen, the user may input a command related to display device 100 to remote controller 127 by touching the soft key of the touchscreen.

In addition, the user input unit 123 may include various types of input means that the user can operate, such as a scroll key, a jog key, etc., and the present embodiment does not limit the scope of the right of the present disclosure.

Recently, as the size of a bezel of the display device 100 decreases, the display device 100 tends to minimize the user input unit 123 of the physical button type exposed externally. Instead, a minimum physical button is located on a rear side or a lateral side, and a user input may be received from a touchpad or the remote controller 127 through a remote signal reception unit 125 that will be described later.

The remote signal reception unit 125 may input a command related to the display device 100 through the remote controller 127 having the user input unit 123. The remote signal reception unit 125 is a sort of the user input unit 123 and may belong to a wireless communication unit because it receives signals from the remote controller 127 according to various communication methods such as Radio Frequency (RF) communication method, Infrared (IR) communication method, etc.

The sensing unit 124 refers to a device that detects a change in the display device 100 or an external change. For example, the sensing unit 124 may include at least one of a proximity sensor, an illumination sensor, a touch sensor, an Infrared (IR) sensor, an ultrasonic sensor, an optical sensor (e.g., a camera), a voice sensor (e.g., a microphone), a battery gauge, an environment sensor (e.g., a hygrometer, a thermometer, etc.), and the like.

Recently, a display device 100 that can move or change a direction of a display has emerged, and a gyro sensor, an acceleration sensor and the like may be provided to detect a posture of the display device.

Based on the information collected by the sensing unit 124, the controller 180 may check the state of the display device 100 and notify a user of a problem when the problem occurs or adjust it by itself, thereby controlling the display device 100 to maintain a best state.

In addition, the content, image quality, and size of an image provided to the display module 151 may be controlled differently depending on a viewer, a surrounding illumination and the like sensed by the sensing unit 124, thereby providing an optimal viewing environment. As smart TVs advance, functions mounted on the display device increase, and the sensing unit 124 is also increasing correspondingly.

The output unit 150 is a device that provides visual and auditory information to a user through the display device, and may include the display module 151 and the audio output unit 152.

The display module 151 may convert an image signal, a data signal, an OSD signal, and a control signal processed by the controller 180 or an image signal, a data signal, and a control signal received from the interface unit to generate a driving signal. The display module 151 may include a display panel having a plurality of pixels.

Each of the plurality of pixels in the display panel may include RGB subpixels. Alternatively, each of the plurality of pixels in the display panel may include RGBW subpixels. The display module 151 may convert an image signal, a data signal, an OSD signal, and a control signal processed by the controller 180 to generate a driving signal for the plurality of pixels.

A plasma display panel (PDP), a liquid crystal display (LCD), an organic light-emitting diode (OLED), or a flexible display may be used as the display module 151, and a 3D display may also be used. The 3D display 130 may be classified as a non-glasses type display or a glasses type display.

The display device 100 includes a display module 151, which occupies a major portion of the front surface thereof, and a case configured to cover the rear surface and the side surface of the display module 151, the case being configured to package the display module 151.

In recent years, the display device 100 has used a flexible display module 150, such as light-emitting diodes (LED) or organic light-emitting diodes (OLED), in order to implement a curved screen. The display module 151 is available.

Light is supplied to an LCD, which was mainly used conventionally, through a backlight unit, since the LCD is not self-emissive. The backlight unit is a device that supplies light emitted from a light source to a liquid crystal uniformly located in front thereof. As the backlight unit has been gradually thinned, a thin LCD has been implemented. However, it is difficult to implement the backlight unit using a flexible material. If the backlight unit is curved, it is difficult to supply uniform light to the liquid crystal, whereby the brightness of a screen is changed.

In contrast, the LED or the OLED may be implemented so as to be curved, since an element constituting each pixel is self-emissive, and therefore no backlight unit is used. In addition, since each element is self-emissive, the brightness of the element is not affected even though the positional relationship between adjacent elements is changed, and therefore it is possible to implement a curved display module 150 using the LED or the OLED.

An organic light-emitting diode (OLED) panel appeared in earnest in mid-2010 and has rapidly replaced the LCD in the small- or medium-sized display market. The OLED is a display manufactured using a self-emissive phenomenon of an organic compound in which the organic compound emits light when current flows in the organic compound. The response time of the OLED is shorter than the response time of the LCD, and therefore afterimages hardly appear when video is implemented.

The OLED is an emissive display product that uses three fluorescent organic compounds having a self-emissive function, such as red, green, and blue fluorescent organic compounds and that uses a phenomenon in which electrons injected at a negative electrode and a positive electrode and particles having positive charges are combined in the organic compounds to emit light, and therefore a backlight unit, which deteriorates color, is not needed.

A light-emitting diode (LED) panel is based on technology of using one LED element as one pixel. Since it is possible to reduce the size of the LED element, compared to a conventional device, it is possible to implement a curved display module 150. The conventional device, which is called an LED TV, uses the LED as a light source of a backlight unit that supplies light to the LCD, and therefore the LED does not constitute a screen.

The display module includes a display panel and a coupling magnet, a first power supply, and a first signal module located at a rear surface of the display panel. The display panel may include a plurality of pixels R, G, and B. The plurality of pixels R, G, and B may be formed at intersections between a plurality of data lines and a plurality of gate lines. The plurality of pixels R, G, and B may be disposed or arranged in a matrix form.

For example, the plurality of pixels R, G, and B may include a red subpixel 'R', a green subpixel 'G', and a blue subpixel 'B'. The plurality of pixels R, G, and B may include a white subpixel 'W'.

The side of the display module 150 on which a picture is displayed may be referred to as a front side or a front surface. When the display module 150 displays the picture, the side of the display module 150 from which the picture cannot be viewed may be referred to as a rear side or a rear surface. Meanwhile, the display module 150 may be constituted by a touchscreen, whereby an input device may also be used in addition to an output device.

The audio output unit 152 receives an audio signal processed by the controller 180 and outputs the same as audio.

The controller 180 may include at least one processor, and may control the overall operation of the display device 100 using the processor included therein. Here, the processor may be a general processor, such as a central processing unit (CPU). Of course, the processor may be a dedicated device, such as an ASIC, or another hardware-based processor.

The controller 180 may demultiplex a stream input through the tuner unit, the demodulation unit the external device interface unit 112, or the network interface unit 113, or may process demultiplexed signals to generate and output a signal for image or audio output.

An image signal processed by the controller 180 may be input to the display module 151, which may display an image corresponding to the image signal. In addition, the image signal processed by the controller 180 may be input to an external output device through the external device interface unit 112.

An audio signal processed by the controller 180 may be output through the audio output unit 152. In addition, the audio signal processed by the controller 180 may be input to an external output device through the external device interface unit 112. Although not shown in FIG. 2, the controller 180 may include a demultiplexing unit and an image processing unit.

Further, the controller 180 may control the overall operation of the display device 100. For example, the controller 180 may control the tuner unit such that a broadcast corresponding to a channel selected by a user or a pre-stored channel is tuned.

In addition, the controller 180 may control the display device 100 according to a user command input through the user input interface unit or an internal program. Meanwhile, the controller 180 may control the display module 151 to display an image. At this time, the image displayed on the display module 151 may be a still image or video, or may be a 2D image or a 3D image.

Meanwhile, the controller 180 may perform control such that a predetermined 2D object is displayed in an image displayed on the display module 151. For example, the object may be at least one of a connected web screen (newspaper or magazine), an electronic program guide (EPG), various menus, a widget, an icon, a still image, video, and text.

Meanwhile, the controller 180 may modulate and/or demodulate a signal using an amplitude shift keying (ASK) method. Here, the amplitude shift keying (ASK) method may be a method of changing the amplitude of a carrier depending on a data value to modulate a signal or restoring an analog signal to a digital data value depending on the amplitude of a carrier.

For example, the controller 180 may modulate an image signal using the amplitude shift keying (ASK) method, and may transmit the modulated image signal through a wireless communication module.

For example, the controller 180 may demodulate and process an image signal received through the wireless communication module using the amplitude shift keying (ASK) method.

As a result, the display device 100 may easily transmit and receive a signal to and from another image display device disposed adjacent thereto without using a unique identifier, such as a media access control (MAC) address, or a complicated communication protocol, such as TCP/IP.

Meanwhile, the display device 100 may further include a photographing unit (not shown). The photographing unit may photograph a user. The photographing unit may be implemented by one camera; however, the present disclosure is not limited thereto. The photographing unit may be implemented by a plurality of cameras. Meanwhile, the photographing unit may be embedded in the display device 100 above the display module 151, or may be separately disposed. Image information photographed by the photographing unit may be input to the controller 180.

The controller 180 may recognize the location of a user based on an image captured by the photographing unit. For example, the controller 180 may recognize the distance between the user and the display device 100 (z-axis coordinate). Further, the controller 180 may recognize an x-axis coordinate and a y-axis coordinate in the display module 151 corresponding to the location of the user.

The controller 180 may sense user gesture based on the image captured by the photographing unit, a signal sensed by the sensor unit, or a combination thereof.

The storage unit 185 may store programs for signal processing and control in the controller 180, and may store a processed image, audio, or data signal. For example, the storage unit 185 may store application programs designed to execute various tasks that can be processed by the controller 180, and may selectively provide some of the stored application programs in response to request of the controller 180.

Programs stored in the storage unit 185 are not particularly restricted as long as the programs can be executed by the controller 180. The storage unit 185 may temporarily store an image, audio, or data signal received from an external device through the external device interface unit 171. The storage unit 185 may store information about a predetermined broadcast channel through a channel memory function, such as a channel map.

FIG. 1 shows an embodiment in which the storage unit 185 and the controller 180 are separately provided; however, the present disclosure is not limited thereto. The storage unit 185 may be included in the controller 180.

The storage unit 185 may include at least one of a volatile memory (e.g., DRAM, SRAM, or SDRAM), a nonvolatile memory (e.g., flash memory), a hard disk drive (HDD), and a solid-state drive (SSD).

The power supply 190 may supply power to the components of the display device 100. In particular, the power supply may supply power to the controller 180, which may be implemented in the form of a system on chip (SOC), the display module 150 for image display, and the audio output unit 160 for audio output.

Specifically, the power supply 190 may include an AC/DC converter (not shown) configured to convert AC power into DC power and a DC/DC converter (not shown) configured to convert the level of the DC power.

The power supply 190 serves to distribute power supplied from the outside to the respective components of the display device. The power supply 190 may be directly connected to an external power supply in order to supply AC power, or may include a battery so as to be used by charging.

In the former case, a cable is used, and the power supply is difficult to move or the movement range of the power supply is limited. In the latter case, the power supply is free to move, but the weight of the power supply is increased in proportion to the weight of the battery, the volume of the power supply is increased, and, for charging, the power supply must be directly connected to a power cable or must be coupled to a charging holder (not shown) that supplies power for a predetermined time.

The charging holder may be connected to the display device through a terminal exposed to the outside, or the battery mounted in the power supply may be charged in a wireless manner when the power supply approaches the charging holder.

Meanwhile, the block diagram of the display device 100 shown in FIG. 1 is for an embodiment of the present disclosure, and elements of the block diagram may be integrated, added, or omitted depending on specifications of an actually implemented display device 100.

That is, two or more elements may be integrated into one element, or one element may be divided into two or more elements, as needed. In addition, the function performed by each block is for describing the embodiment of the present disclosure, and the specific operations and components thereof do not limit the scope of rights of the present disclosure.

Figure 2:
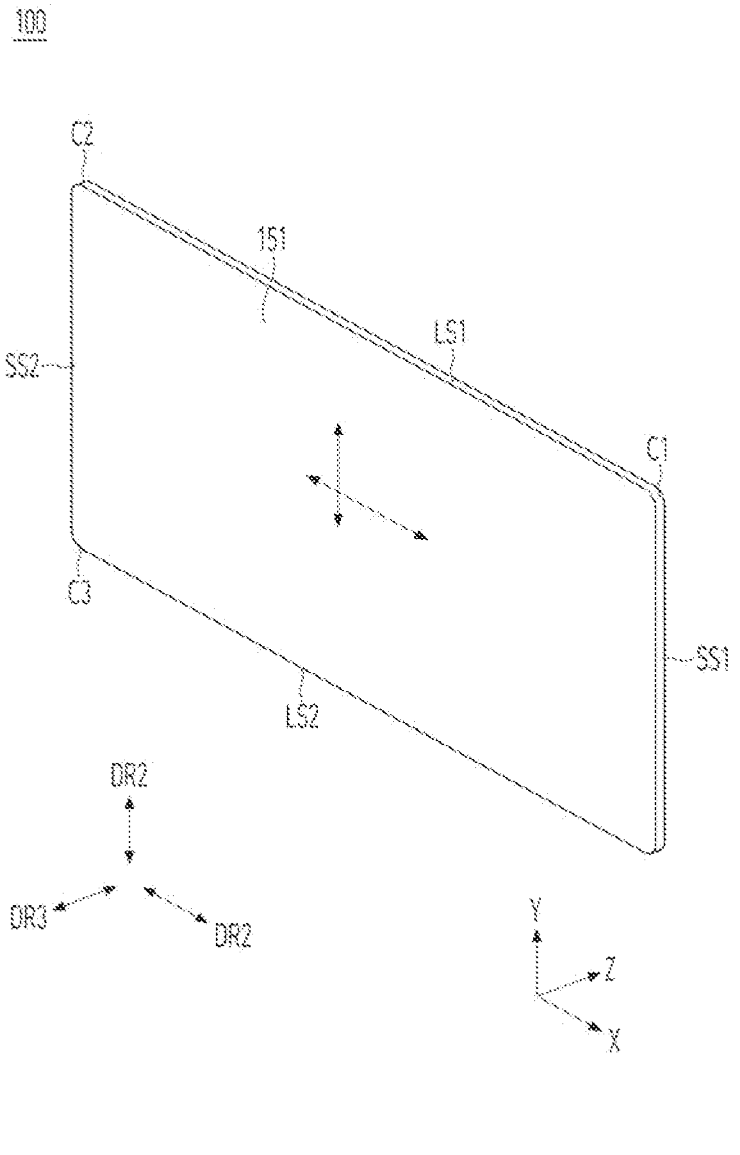
FIG. 2 is a perspective view showing an example of the display device according to the present disclosure.

FIG. 2 is a front perspective view showing an example of the display device.

Referring to FIG. 2, the display device 100 may have a rectangular shape including a first long side LS1, a second long side LS2 opposite the first long side LS1, a first short side SS1 adjacent to the first long side LS1 and the second long side LS2, and a second short side SS2 opposite the first short side SS1.

Here, the area of the first short side SS1 may be referred to as a first side area, the area of the second short side SS2 may be referred to as a second side area opposite the first side area, the area of the first long side LS1 may be referred to as a third side area adjacent to the first side area and the second side area and located between the first side area and the second side area, and the area of the second long side LS2 may be referred to as a fourth side area adjacent to the first side area and the second side area, located between the first side area and the second side area, and opposite the third side area.

In addition, the lengths of the first and second long sides LS1 and LS2 are shown and described as being greater than the lengths of the first and second short sides SS1 and SS2, for convenience of description; however, the lengths of the first and second long sides LS1 and LS2 may be approximately equal to the lengths of the first and second short sides SS1 and SS2.

Also, in the following description, a first direction DR1 may be a direction parallel to the long sides LS1 and LS2 of the display device 100, and a second direction DR2 may be a direction parallel to the short sides SS1 and SS2 of the display device 100. A third direction DR3 may be a direction perpendicular to the first direction DR1 and/or the second direction DR2.

From a different point of view, the side of the display device 100 on which a picture is displayed may be referred to as a front side or a front surface. When the display device 100 displays the picture, the side of the display device 100 from which the picture cannot be viewed may be referred to as a rear side or a rear surface. When viewing the display device 100 from the front side or the front surface, the side of the first long side LS1 may be referred to as an upper side or an upper surface. In the same manner, the side of the second long side LS2 may be referred to as a lower side or a lower surface. In the same manner, the side of the first short side SS1 may be referred to as a right side or a right surface, and the side of the second short side SS2 may be referred to as a left side or a left surface.

In addition, the first long side LS1, the second long side LS2, the first short side SS1, and the second short side SS2 may be referred to edges 351 of the display device 100. In addition, points at which the first long side LS1, the second long side LS2, the first short side SS1, and the second short side SS2 are joined to each other may be referred to as corners. For example, a point at which the first long side LS1 and the first short side SS1 are joined to each other may be a first corner C1, a point at which the first long side LS1 and the second short side SS2 are joined to each other may be a second corner C2, a point at which the second short side SS2 and the second long side LS2 are joined to each other may be a third corner C3, and a point at which the second long side LS2 and the first short side SS1 are joined to each other may be a fourth corner C4.

Here, a direction from the first short side SS1 to the second short side SS2 or a direction from the second short side SS2 to the first short side SS1 may be referred to as a leftward-rightward direction LR. A direction from the first long side LS1 to the second long side LS2 or a direction from the second long side LS2 to the first long side LS1 may be referred to as a vertical direction UD.

Figure 3:
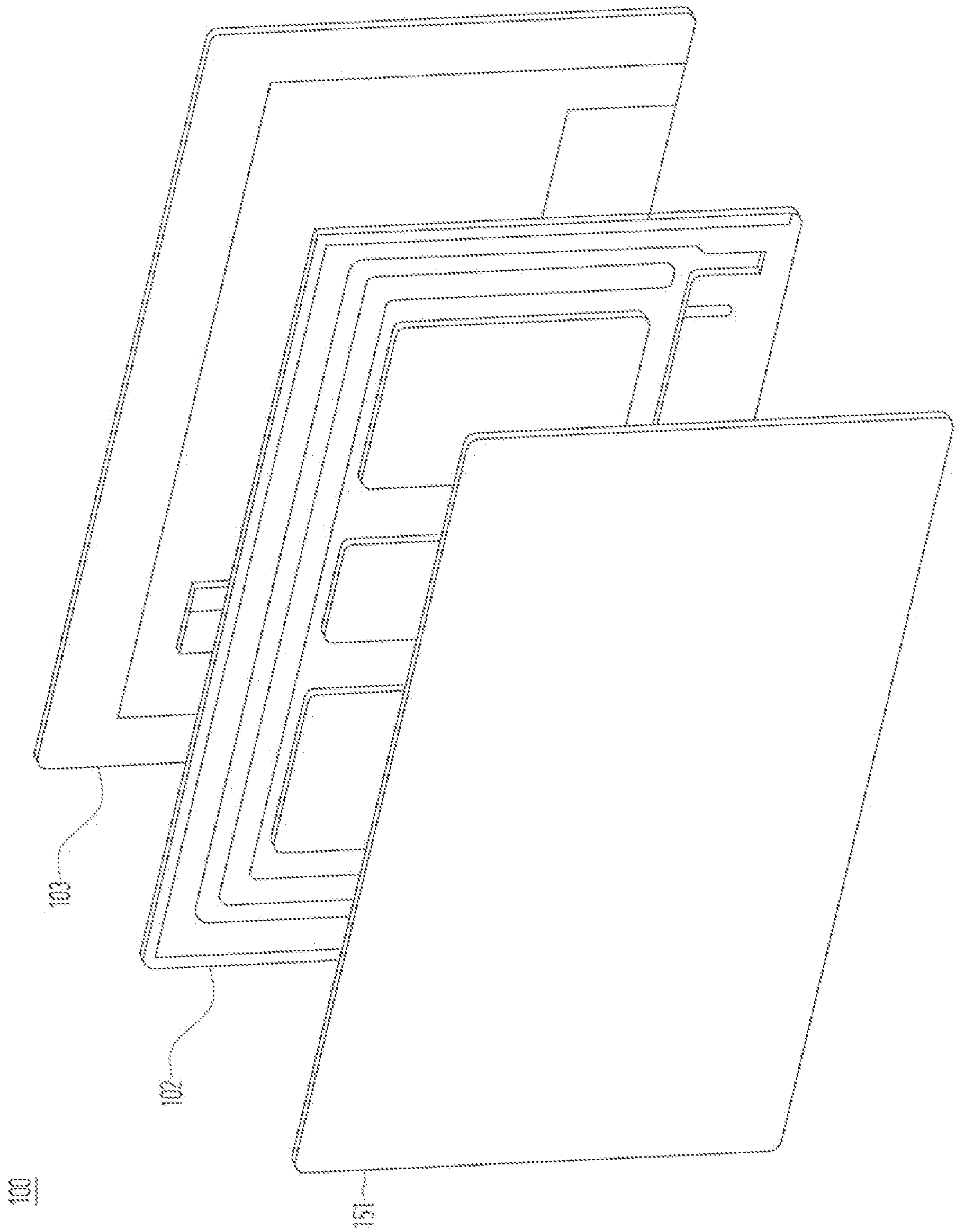
FIG. 3 is an exploded perspective view showing the example of the display device according to the present disclosure.

FIG. 3 is an exploded view of the display device 100. The display device 100 may include the display module 151, a module cover 102 that covers a rear surface of the display module 151, and a back cover 103 that covers components mounted on a rear surface of the module cover 102 and is coupled to the rear surface of the module cover 102.

A flexible board extending from an end of the display module 151 may be bent rearwards to be connected to a control board mounted on the module cover 102. When using a liquid crystal panel, the display module 151 may be formed by sequentially seating a light source substrate, an optical sheet, and the liquid crystal panel using a panel guide.

The display device 100 in a type of being mounted by hanging on the wall may include a structure (not shown) to be fastened to a wall surface at the rear surface thereof, and the display device 100 in a type of being mounted by standing on the floor may include a stand (not shown) extending downwardly of the display module 151.

Recently, as the display module 151 has become thinner, a case top constituting a bezel located at a periphery of a front surface of the display module 151 may also become thinner or be omitted. For example, as shown in FIG. 2, in the case of OLED panel, the backlight unit is omitted and a laterally exposed layered structure is simpler than that of the liquid crystal display module, so that the case top may be omitted.

To reduce the number of members as much as possible to reduce a size of the display device 100, as shown in FIG. 3, only the module cover 102 made of a metal material may be disposed directly on the rear surface of the display module to support the rear surface of the display module, and a board may be disposed as a controller on the rear surface of the module cover 102. Because the controller located on the rear surface of the module cover 102 must be exposed for repair, the back cover 103 may be coupled to the module cover 102 in a detachable form. A rear surface of the existing display device 100 was a material facing the wall, so that an importance of exterior design thereof was low. However, the recent display device 100 may also be in a portable form, so that the rear surface also has become an important design element.

Therefore, there is a need to combine the back cover 103 with the module cover 102 in a manner that does not expose a fastening structure such as a screw head to the rear surface.

Figure 4:
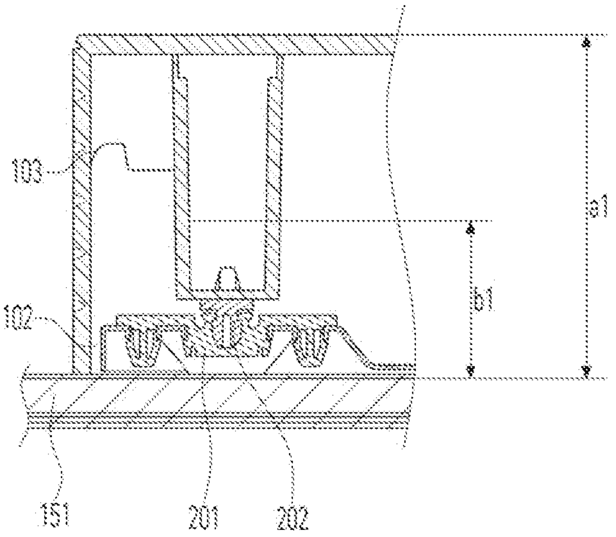
FIG. 4 is a diagram showing a method for fastening an existing display device.

FIG. 4 is a diagram showing a method for fastening the existing display device 100. To remove the screw exposed on the rear surface, a pair of holders that may be fastened together may be used. As shown in FIG. 4, a first holder 202 located on the back cover 103 and a second holder 201 located on the module cover 102 and fastened to the first holder 202 may be included.

The first holder 202 and the second holder 201 may be made of a material with a predetermined rigidity, such as nylon, and may be coupled to each other or separated from each other by applying a strong force. To implement a structure in which the first holder coupled to the back cover 103 is fastened, the back cover 103 needs a structure with a predetermined thickness. Additionally, because of an overlapping structure of the two holders, the rear surface structure of the display module becomes thicker.

In addition, the module cover 102 may be made of the metal material for the rigidity, and the back cover 103 may be formed via injection molding to reduce a weight, increase ease of molding, and reduce a cost.

Thermal expansion may occur because of heat generated when the display device 100 operates, and because the back cover 103 and the module cover 102 are made of different materials, there may be a difference in a degree of the thermal expansion. However, in the embodiment in FIG. 4, when there is a difference in a degree of thermal deformation between the module cover 102 and the back cover 103 because of a difference in thermal expansion coefficient, bending deformation of the display device 100 may occur or the holder may be damaged.

Accordingly, the present disclosure is to provide a fastening structure of the back cover 103 that may implement the slim display device 100 while providing a structure that is not exposed to the outside and does not damage the fastening structure by the thermal expansion.

Figure 5:
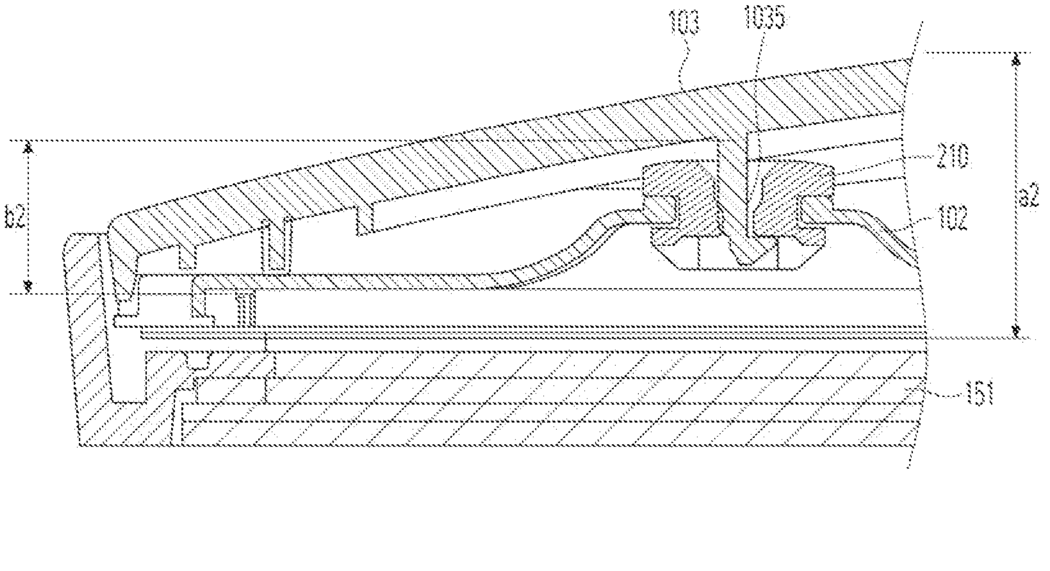
FIG. 5 is a cross-sectional view showing a fastening structure of a back cover of a display device of the present disclosure.
Figure 6:
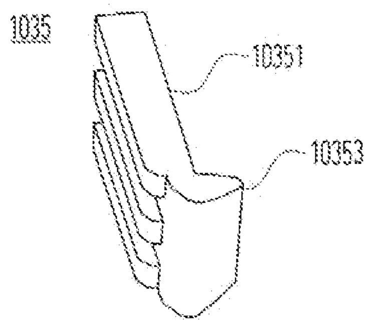
FIG. 6 is a perspective view showing a latch and a holder hole of a display device of the present disclosure.
Figure 6:
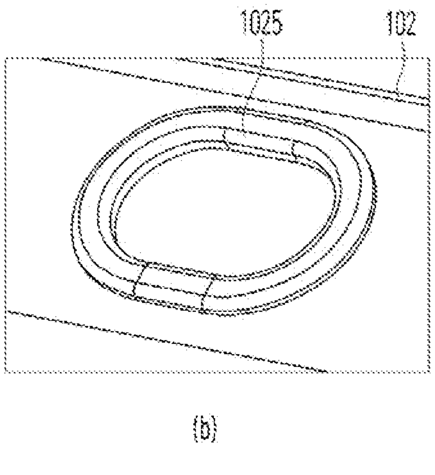

FIG. 5 is a cross-sectional view showing the fastening structure of the back cover 103 of the display device 100 of the present disclosure, and FIG. 6 is a perspective view showing a latch 1035 and a holder hole 1025 of the display device 100 of the present disclosure.

FIG. 5 shows one fastening structure. A plurality of fastening structures may be included at locations spaced apart from each other. The number of fastening structures may vary depending on an area of the display device 100.

The fastening structure of the back cover 103 of the present disclosure may include the latch 1035 protruding forward from the back cover 103, a latch hole 215 fastened to the latch 1035, and a holder rubber 210 coupled to the module cover 102.

The module cover 102 may include the holder hole 1025 into which the holder rubber 210 is inserted. As shown in FIG. 5, the holder rubber 210 may be inserted into the holder hole 1025 of the module cover 102 and may be located on the front surface and the rear surface of the module cover 102. To provide a space for the holder rubber 210 to be located, a portion where the holder hole 1025 is defined may protrude rearwards.

As shown in (b) in FIG. 6, the holder hole 1025 may include hemming at a periphery. The hemming is a method for treating an end of a plate-shaped member. For rigidity of the holder hole 1025, the periphery of the holder hole 1025 may be thicker than other areas.

The hemming may increase the thickness of the edge of the hole by folding a thin plate or expanding the hole when defining the holder hole 1025. A work of forming the hemming is called a hemming work. Because a supporting force of the holder rubber 210 may be improved via the hemming work, the latch 1035 fastened to the holder rubber 210 may be stably coupled.

The latch 1035 may include an extending portion 10351 extending forwards from the front surface of the back cover 103 and includes a hook 10353 protruding laterally from an end of the extending portion 10351. As shown in (a) in FIG. 6, the extending portion 10351 may have a cross-section with a length in a first direction D1 greater than a length in a second direction D2, and the hook 10353 may extend in the second direction D2.

Figure 7:
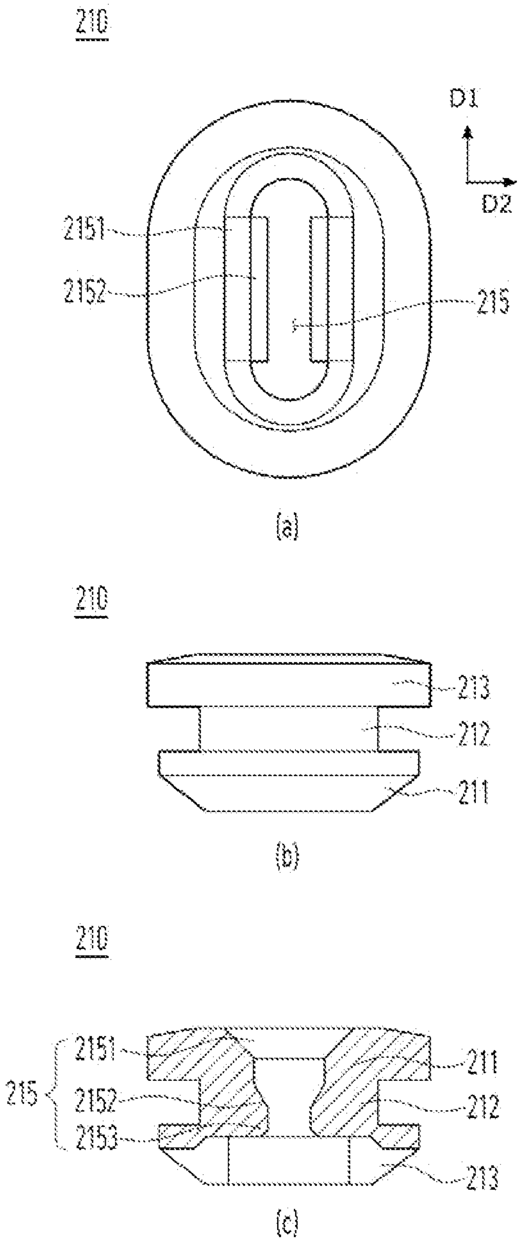
FIG. 7 is a diagram showing a holder rubber of a display device of the present disclosure.

FIG. 7 is a diagram showing the holder rubber 210 of the display device 100 of the present disclosure. The holder rubber 210 may have an oval shape and may include the latch hole 215 with a length in the first direction D1 greater than a length in the second direction D2 like the extending portion 10351 of the latch 1035 such that the latch 1035 may be inserted thereinto.

Based on (a) in FIG. 7, the first direction D1 is a vertical direction and the second direction D2 is a horizontal direction. The holder rubber 210 may have a symmetrical structure and may have the latch hole 215 that is longer in the first direction D1 than the latch 1035. In other words, the latch 1035 may have a fixing force in the second direction D2, but may vary in location within the latch hole 215 in the first direction D1.

Because the display device 100 has a great thermal deformation tolerance in a longitudinal direction, the first direction D1 may be the longitudinal direction of the display device 100 and the second direction D2 may be a short side direction of the display device 100.

The display device 100 has a rotatable form, but in terms of a general screen ratio, a horizontal direction is a long side direction and a vertical direction is the short side direction, so that the first direction D1 may be referred to as the horizontal direction and the second direction D2 may be referred to as the vertical direction.

When fastening the back cover 103, after the latch 1035 at an upper side of the back cover 103 is fastened to the holder rubber 210, a lower side of the back cover 103 is pushed forward to fasten the latch 1035 at the lower side to the holder rubber 210, so that the hook 10353 protrudes downwards to facilitate the fastening. Accordingly, the second direction D2 in which the aforementioned hook 10353 protrudes may be more accurately the downward direction.

Referring to (b) in FIG. 7, the holder rubber 210 may be composed of a first portion 211 located on the front surface of the module cover 102 to be fixed to the holder hole 1025, a second portion located inside of the holder hole 1025, and a third portion 213 located on the rear surface of the module cover 102.

Because the second portion 212 is located inside the holder hole 1025, an outer size thereof may correspond to a size of the holder hole 1025 and diameters of the first portion 211 and the third portion 213 may be greater than a diameter of the holder hole 1025 to support the holder rubber 210 so as not to be deviated from the holder hole 1025. The first portion 211, the second portion 212, and the third portion 213 may have different outer diameters, so that steps may be formed as shown in (b) in FIG. 7.

Because the holder rubber 210 must be pushed into the holder hole 1025, the first portion 211 of the holder rubber 210 has an inclined surface that increases in size in the rearward direction, and a front end of the first portion 211 is smaller than the holder hole 1025, so that it is easy to insert the holder rubber 210 into the holder hole 1025.

(c) in FIG. 7 shows a cross-section of the holder rubber 210, and a shape of the latch hole 215 of the holder rubber 210 is shown. The latch hole 215 is a structure in which the latch 1035 is inserted and fixed as shown in FIG. 5. Based on the shape of the latch 1035 longer in the first direction D1, the latch hole 215 is also longer in the first direction D1 as shown in (a) in FIG. 7.

The latch hole 215 may include an entry portion 2151, which is an entrance portion into which the latch 1035 is inserted, and an engaging portion 2152 into which the hook 10353 of the latch 1035 is engaged. The engaging portion 2152 expands while forming a step at a front end of the entry portion 2151 and has a size greater than the entry portion 2151. The hook 10353 of the latch 1035 is fixed by being caught on the step between the engaging portion 2152 and the entry portion 2151.

The entry portion 2151 of the latch hole 215 may have an inclined surface to facilitate the insertion of the latch 1035. Because the hook 10353 protrudes in the second direction D2, the entry portion 2151 may have the inclined surface in the second direction D2, but the inclined surface may be omitted in the first direction D1.

A length in the first direction D1 of the latch hole 215 may be greater than the length in the first direction D1 of the latch 1035 to allow a movement in the first direction D1 of the latch 1035 resulted from the thermal expansion, and a length in the second direction D2 of the latch hole 215 may correspond to or smaller than a size of the extending portion 10351 of the latch 1035 to fix the latch 1035.

Because the entry portion 2151 of the latch hole 215 includes the inclined surface, herein, the size in the first direction D1 and the size in the second direction D2 mean lengths of the narrowest portion.

Because the size of the latch hole 215 is greater, the holder rubber 210 may not only receive the deformation resulted from the thermal expansion, but may also be made of an elastic material to be easily inserted into the holder hole 1025 and to receive the movement of the latch 1035 to some extent. For example, a thermoplastic elastomer (TPE) with a hardness equal to or higher than 70 and equal to or lower than 80 may be used.

More specifically, thermoplastic styrene (TPS) may be used. The thermoplastic styrene is a chemical material that combines a styrene-based polymer material with a rubber material such as butadiene. The thermoplastic styrene has excellent elasticity, feel, and transparency, and is able to be prepared with various hardnesses depending on a material composition.

The display device 100 of the present disclosure has the thin fastening structure, so that the thin display device 100 may be implemented.

In the display device 100 of the present disclosure, the holder rubber 210 may be made of the elastic material and may fix the latch 1035, thereby achieving stable fastening force while receiving an error resulted from the thermal expansion.

The fastening structure of the display device 100 of the present disclosure has simple configuration, which may reduce a manufacturing cost.

The above embodiments are to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

What is claimed is:

1. A display device comprising:

a display panel having a length in a first direction greater than a length in a second direction;

a module cover supporting a rear surface of the display panel and including a holder hole defined therein;

a back cover covering a rear surface of the module cover;

a holder rubber made of an elastic material, fixed to the holder hole, and including a latch hole defined therein; and a latch protruding from a front surface of the back cover and fastened to the latch hole of the holder rubber, wherein the latch includes an extending portion having a length in the first direction greater than a length in the second direction and a hook protruding from the extending portion in the second direction, and wherein the holder rubber has an oval shape with a length in the first direction greater than a length in the second direction.

2. The display device of claim 1, wherein the holder rubber includes:

a first portion located on a front surface of the module cover;

a second portion located inside the holder hole and having a diameter corresponding to a size of the holder hole; and a third portion located on the rear surface of the module cover, wherein diameters of the first portion and the third portion are greater than the size of the holder hole.

3. The display device of claim 2, wherein the first portion includes an inclined surface widening rearward.

4. The display device of claim 1, wherein the second direction is a downward direction of the display device.

5. The display device of claim 4, wherein the latch hole includes:

an entry portion with an inclined surface narrowing forward; and an engaging portion expanding while forming a step at a front end of the entry portion, wherein the hook of the latch is caught on the step between the engaging portion and the entry portion.

6. The display device of claim 5, wherein a size of a portion of the entry portion connected to the engaging portion is greater than a size of the latch in the first direction.

7. The display device of claim 5, wherein a size of a portion of the entry portion connected to the engaging portion is equal to or smaller than a size of the extending portion of the latch in the second direction.

8. The display device of claim 1, wherein the holder hole includes hemming at a periphery.

9. The display device of claim 1, wherein the module cover has a portion where the holder hole is defined protruding rearward.

* * * * *